United States Patent [19]

Kinugawa

[11] Patent Number: 4,841,633
[45] Date of Patent: Jun. 27, 1989

[54] METHOD OF MOUNTING ELECTRONIC PARTS ONTO SINGLE-SIDED PRINTED WIRING BOARD

[75] Inventor: Seiichi Kinugawa, Nara, Japan

[73] Assignee: Sharp Kabushiki Kaisha, Osaka, Japan

[21] Appl. No.: 267,290

[22] Filed: Nov. 4, 1988

Related U.S. Application Data

[63] Continuation of Ser. No. 835,752, Mar. 3, 1986, abandoned.

[30] Foreign Application Priority Data

Mar. 6, 1985 [JP] Japan ................................. 60-45666

[51] Int. Cl.$^4$ ............................................. H05K 3/30
[52] U.S. Cl. ....................................... 29/837; 29/840; 29/847
[58] Field of Search ................ 29/832, 836, 837, 840, 29/846, 847, 848

[56] References Cited

U.S. PATENT DOCUMENTS

| | | | |
|---|---|---|---|
| 2,777,192 | 1/1957 | Albright et al. ...................... | 29/837 |
| 3,061,911 | 11/1962 | Baker .................................... | 29/847 |
| 3,152,388 | 10/1964 | Grossman ............................. | 29/837 |
| 3,470,043 | 9/1969 | Whitfield ........................... | 29/846 X |

FOREIGN PATENT DOCUMENTS

| | | |
|---|---|---|
| 0144944 | 6/1985 | European Pat. Off. . |
| 1981360 | 12/1967 | Fed. Rep. of Germany . |
| 2306288 | 2/1972 | Fed. Rep. of Germany . |
| 2427335 | 6/1973 | Fed. Rep. of Germany . |
| 2633884 | 7/1975 | Fed. Rep. of Germany . |
| 2854271 | 12/1977 | Fed. Rep. of Germany . |
| 58672 | 5/1978 | Japan ................................. 29/847 |
| 787599 | 6/1955 | United Kingdom . |
| 773015 | 4/1957 | United Kingdom . |
| 864479 | 8/1957 | United Kingdom . |
| 1015827 | 1/1966 | United Kingdom . |
| 1552444 | 9/1979 | United Kingdom . |
| 2035701 | 6/1980 | United Kingdom . |
| 2046519 | 11/1980 | United Kingdom . |
| 2047474 | 11/1980 | United Kingdom . |
| 2118371 | 10/1983 | United Kingdom . |
| 1458643 | 12/1986 | United Kingdom . |

OTHER PUBLICATIONS

Copy of British Office Action dated Jun. 16, 1988.

*Primary Examiner*—Timothy V. Eley
*Attorney, Agent, or Firm*—Birch, Stewart Kolasch & Birch

[57] ABSTRACT

Disclosed is a method of mounting electronic parts onto a single-sided printed wiring board, including the provision of a key contact pattern on the front surface of a substrate member having a plurality of through-holes; the provision of a conductive pattern covering these through-holes on the front surface of the substrate member; and the mounting of electronic parts in position relative to these through-holes from the rear surface of the substrate member.

12 Claims, 3 Drawing Sheets

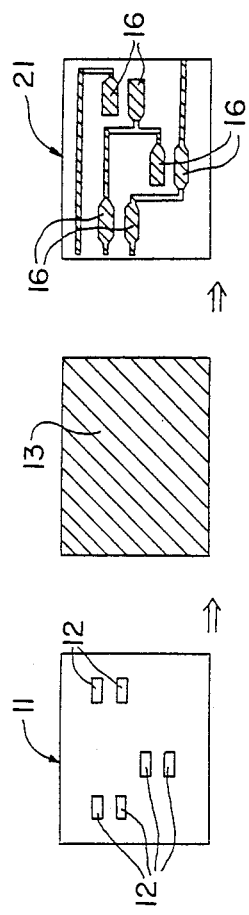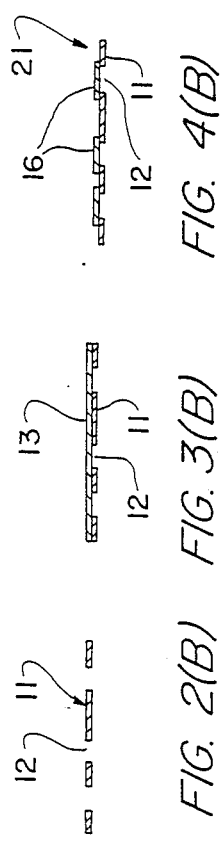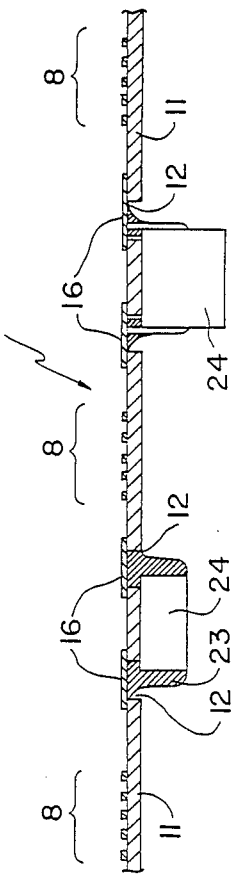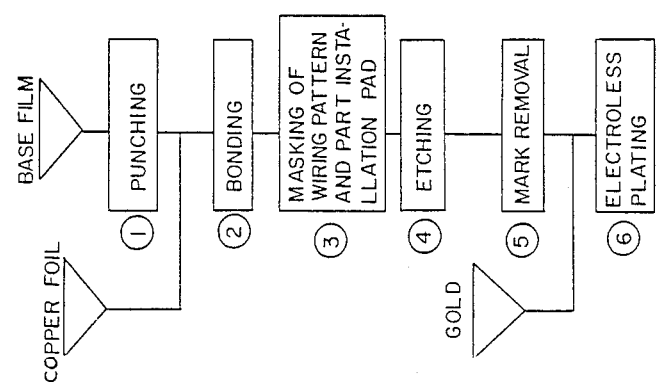

METHOD OF MOUNTING ELECTRONIC PARTS ONTO SINGLE-SIDED PRINTED WIRING BOARD

This application is a continuation of application Ser. No. 835,752 filed on Mar. 3, 1986, now abandoned.

BACKGROUND OF THE INVENTION

The present invention relates to a system of mounting electronic parts onto a single-sided printing wiring board, and is particularly suitable for the manufacture of electronic equipment requiring key contacts, such as electronic calculators.

All conventional electronic equipment incorporating key contacts requires the key contact surface to be perfectly flat. To achieve this, manufacturers use a double-sided printed wiring board 1 as shown in FIG. 8, providing one of the surfaces 2 with a key contact pattern (not shown) and the other surface 3 with a variety of electronic parts 4. Both surfaces are electrically connected via through-holes 5. However, a double-sided printed wiring board 1 is relatively expensive. A single-sided printed wiring board as shown in FIG. 9 is more economical, but as the area peripheral to the key contact pattern 8 should be flat, such a board requires the key contact pattern area 8 to be separate from the electronic part mounting area 9. In consequence, a single-sided printed wiring board 7 is larger, going against today's trends towards miniaturization.

SUMMARY OF THE INVENTION

The present invention provides means for installing electronic parts onto a single-sided printed wiring board while keeping the area peripheral to the key contact pattern flat without any increase in board size, resulting in cost reductions. To summarize, the present invention is a single-sided printed wiring board to economically replace a double-sided one.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from the following detailed description.

To achieve this, the present invention provides a system for mounting electronic parts onto a single-sided printed wiring board which has the key contact pattern on the front surface and a number of through-holes covered by a conductive pattern. Electronic parts are mounted into said through-holes from the rear surface of the printed wiring board.

BRIEF DESCRIPTION OF THE DRAWINGS

The present invention will be better understood from the detailed description given hereinbelow and the accompanying drawings which are given by way of illustration only, and thus are not limitative of the present invention and in which:

FIG. 1 is a flowchart describing the manufacturing procedure for a single-sided printed wiring board reflecting one of the preferred embodiments of the present invention; FIGS. 2(A), FIG. 3(A) and FIG. 4(A) are top plan views denoting the respective steps related to the manufacture of a single-sided printed wiring board reflecting one of the preferred embodiments of the present invention;

FIG. 2(B), FIG. 3(B), and FIG. 4(B) are sectional views denoting steps in the manufacture of such a single-sided printed wiring board;

FIG. 5 is a sectional view of the said single-sided printed wiring board reflecting one of the preferred embodiments of the present invention;

DETAILED DESCRIPTION OF THE PREFERRED EMBODIMENTS

Figure 6:
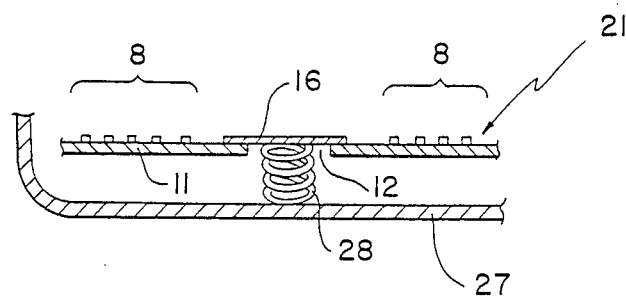
FIGS. 6 and 7 are sectional views of another preferred embodiment.

Referring now to the production flowchart in FIG. 1, the procedure related to the manufacture of thin, single-sided printed wiring boards is described below. When first punching out base film substrate 11 made of glass epoxy resin, polymide resin, or polyester resin, etc. shown in FIG. 2(A) and (B), a specific number of through-holes 12 are simultaneously punched out to allow insertion of electronic parts. A copper foil 13 is next bonded over the prepared substrate 11 as shown in FIG. 3(A) and (B). Conductive patterns, including the wiring pattern, the key-contact pattern, and the part-insertion members (through-holes 12), are first masked on the cooper foil 13, etched, then masking materials are removed. Then, electrodeless gold plating is applied resulting in a single-side printed wiring board 21 shown in FIG. 4(A) and (B).

A conductive pattern 16 blocks through-hole(s) 12 on the front surface of board 21. On its front surface, this board 21 is provided with a number of conductive patterns 16 between key contact patterns 8 as shown in FIG. 5. Chip parts 24 are mounted on solder pads whose positions correspond to the through-holes 12 located on the rear surface where the positions of through-holes 12 respectively match the conductive patterns 16. Chip parts 24, are soldered to those conductive patterns 16, at the corresponding through-holes 12.

One of the preferred embodiments first provides a key-contact pattern 8, on the front surface of the board 21 and enables chip parts 24 to be mounted from the rear surface in positions corresponding to through-holes 12 and then soldered to conductive patterns 16. This method allows the peripheral area of key-contact pattern 8 of a single-sided printed wiring board to be perfectly flat, inexpensive yet compact and produced economically.

FIG. 6 denotes another preferred embodiment of the present invention. If the external metallic panel 27 of a single-sided printed wiring board 21 is grounded, both the conductive pattern 16 and external metallic panel 27 are electrically connected to each other via coil spring 28 at through-hole 12 so that no external static charge can adversely affect the wiring board. Note that identical reference numerals are used in both FIGS. 5 and 6 for denoting identical components.

Figure 7:
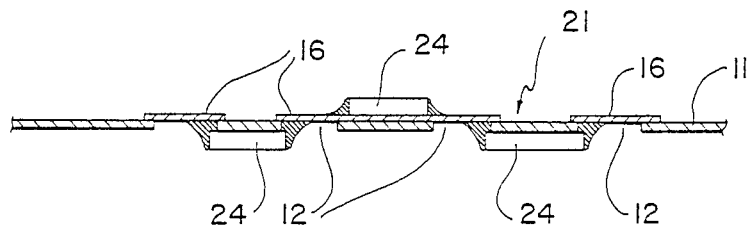
Figure 8:
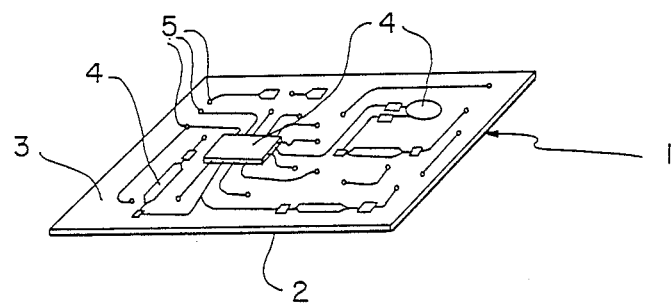
FIG. 8 is a perspective view of a conventional double-sided printed wiring board.
Figure 9:
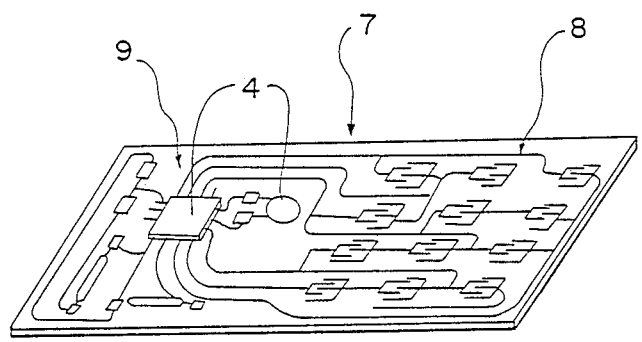
FIG. 9 is a perspective view of a conventional double-sided and single-sided printed wiring board respectively.

FIG. 7 denotes another preferred embodiment, in which chip parts 24, are mounted on both the front and rear surfaces of a single-sided printed wiring board 21. Although not shown, the preferred embodiment shown in FIG. 5 allows complicated wiring on the printed wiring board to be easily implemented by replacing the solder-side chip parts with jumper wires. In addition, it allows the entire unit to be compact. In addition to a base film substrate, any conventionally available solid substrate may also be used for the base substrate. Likewise, chip parts may also be replaced by standard parts.

As is clear from the foregoing detailed description, according to the present invention, electronics parts are mounted in specific positions corresponding to through-holes from the rear side of a single-sided printed wiring board having a key contact pattern on its front surface and a conductive pattern covering the through-holes. Manufacturers can correctly install electronic parts without increasing the area peripheral to the key contact pattern and by maintaining its flatness, thus realizing compact size and reduced cost. While only certain embodiments of the present invention have been described, it will be apparent to those skilled in the art that various changes and modifications may be made therein without departing from the spirit and scope of the present invention as claimed.

What is claimed is:

1. A method of mounting electronic parts onto a circuit board comprising the steps of:
   (a) providing a board with at least one through-hole;
   (b) providing a conductive pattern on one side of said board with a portion of said conductive pattern covering said at least one through-hole;
   (c) providing at least one electrical component in said at least one through-hole and connecting said component to said portion of said conductive pattern and
   (d) providing a key-contact pattern on said one side of said board.

2. The method according to claim 1, wherein the step of providing a conductive pattern on one side of said board includes the steps of:
   bonding a conductive foil to said one side of said board followed by the step of;
   masking said conductive foil with the conductive pattern followed by the step of;
   etching said conductive foil to form the conductive pattern and followed by the step of;
   removing said masking.

3. The method according to claim 2, including an additional preparation step of providing an electroless gold plating on said one side of said board after the step of removing said masking.

4. The method according to claim 2, wherein said conductive foil is copper foil.

5. The method according to claim 1, wherein the step of providing said board with at least one through-hole is a punching process.

6. The method according to claim 1, including the step of providing at least one additional electrical component connected to said conductive pattern on said one side of said board.

7. A method of mounting electronic parts onto a circuit board having a substantially planar portion comprising the steps of:
   providing at least one through-hole through said planar portion of said board;
   providing a conductive pattern on one side of said board with a portion of said conductive pattern covering said at least one through-hole;
   providing at least one electrical component having a portion passing through said at least one through-hole and connecting said component to said portion of said conductive pattern and
   providing a key-contact pattern on said one side of said board.

8. The method according to claim 7, including the step of providing and connecting a conductive coil spring at one end to said conductive pattern and connecting an opposite end of said spring to a grounding member of an electronic device for grounding the circuit board.

9. The method according to claim 7, including the step of providing at least one additional electrical component and connecting it to said conductive pattern at said one side of said board.

10. A circuit board comprising:
    a board having a substantially planar portion;
    at least one through-hole provided through said planar portion of said board;
    a conductive pattern disposed on one side of said board with a portion of said conductive pattern covering said at least one through-hole;
    at least one electrical component having a portion disposed within said at least one through-hole and connected to said portion of said conductive pattern and
    a key-contact pattern on said one side of said board.

11. The circuit board according to claim 10, including a conductive coil spring connected to one end to said conductive pattern whereby an opposite end of said spring is connected to a grounding member of an electronic device for grounding the circuit board.

12. The circuit board according to claim 10, wherein at least one additional electrical component is connected to said conductive pattern at said one side of said board.

* * * * *